United States Patent [19]
Boezen et al.

[11] Patent Number: 5,229,733
[45] Date of Patent: Jul. 20, 1993

[54] AMPLIFIER ARRANGEMENT FOR PROTECTING THE POWER TRANSISTORS IN CASE OF A SHORT-CIRCUIT

[75] Inventors: Hendrik Boezen; Rafaël A. G. Goes; Arnoldus B. H. J. Basten, all of Nijmegen, Netherlands

[73] Assignee: U.S. Philips Corporation, New York, N.Y.

[21] Appl. No.: 889,032

[22] Filed: May 26, 1992

[30] Foreign Application Priority Data

May 27, 1991 [EP] European Pat. Off. ........ 91201263.0

[51] Int. Cl.$^5$ .............................. H02H 7/20
[52] U.S. Cl. ................................. 330/298; 455/217
[58] Field of Search ............... 330/146, 207 P, 298; 455/117, 217

[56] References Cited

U.S. PATENT DOCUMENTS 4,714,898 12/1987 Botti et al. ..................... 330/298
5,097,225 3/1992 Boezen et al. ................. 330/298

Primary Examiner—Steven Mottola
Attorney, Agent, or Firm—Edward W. Goodman

[57] ABSTRACT

An amplifier arrangement includes a first amplifier (A1) having a first output terminal (5) for the connection of a first terminal of a load and having at least a first power transistor (PT1) with a main current path for carrying a first current (i1), which current (i1) is related to a first load current flowing via the first output terminal (5), a second amplifier (A2) having a second output terminal (6) for the connection of a second terminal of the load and having at least a second power transistor (PT2) with a main current path for carrying a second current (i2), which current (i2) is related to a second load current flowing via the second output terminal (6) a first circuit (M1) for generating a first signal (s1), which signal (s1) is related to the first current (i1), a second circuit (M2) for generating a second signal (s2), which signal (s2) is related to the second current (i2), a third circuit (M3) for generating at least one control signal (r1, r2), which control signal (r1, r2) is related to a sum of the first (s1) and the second (s2) signal, and a protection circuit for limiting the first and the second load current depending upon the control signal (r1, r2), the third circuit (M3), in addition to being adapted to generate the control signal (r1, r2), being adapted to supply a first short-circuit current (k1) to one of the output terminals (5, 6) during a first short-circuit mode and to supply a second short-circuit current (k2) to one of the output terminal (5, 6) during a second short-circuit mode, which short-circuit currents (k1, k2) are related to the sum of the first (s1) and the second (s2) signal.

14 Claims, 1 Drawing Sheet

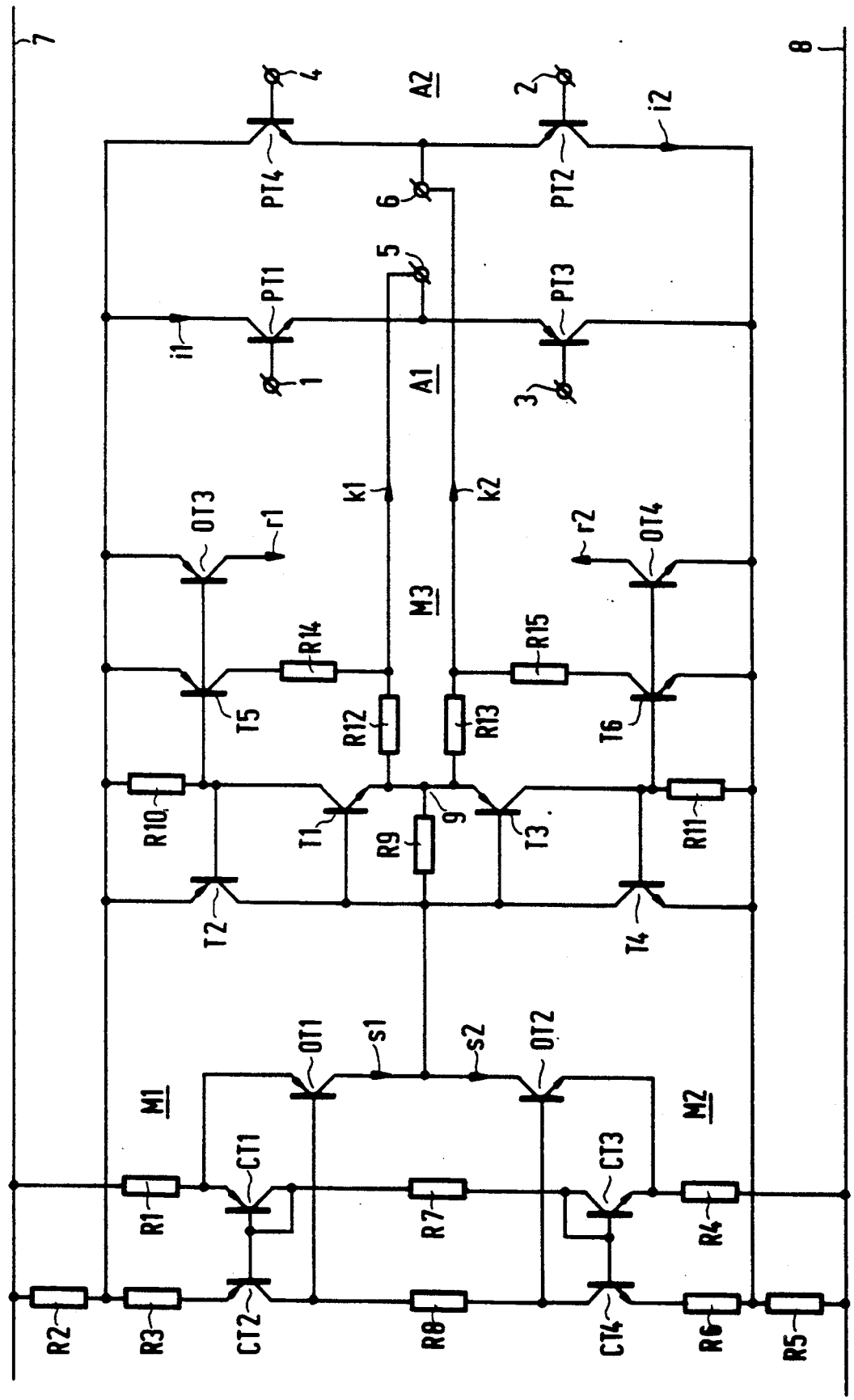

AMPLIFIER ARRANGEMENT FOR PROTECTING THE POWER TRANSISTORS IN CASE OF A SHORT-CIRCUIT

BACKGROUND OF THE INVENTION

1. Field of the Invention

The invention relates to an amplifier arrangement comprising a first amplifier having a first output terminal for the connection of a first terminal of a load and having at least a first power transistor with a main current path for carrying a first current, this current being related to a first load current flowing via the first output terminal, a second amplifier having a second output terminal for the connection of a second terminal of the load and having at least a second power transistor with a main current path for carrying a second current, this current being related to a second load current flowing via the second output terminal, first means for generating a first signal, this first signal being related to the first current, second means for generating a second signal, this second signal being related to the second current, third means for generating at least one control signal, this control signal being related to a sum of the first signal and the second signal, and protection means for limiting the first and the second load current depending upon the control signal.

Such an amplifier arrangement can be used in general for driving a load coupled between two amplifiers, the amplifiers being protected from supplying excessive load currents, and can be used in particular in car-radios, where short-circuits to a supply potential form an ever present hazard.

2. Description of the Related Art

Such an amplifier arrangement is known inter alia from European Patent Application 90201757.3. In the same way as the amplifier arrangement defined above, the amplifier arrangement described in said patent application generates the first and the second signal with the aid of first and second means, respectively, on the basis of the first and second signals third means generate the control signal, the control signal being used for controlling the protection means. In the event of a short-circuit, the protection means actuated by the control signal ensures that a drive applied to the power transistors is removed in order to prevent the power transistors from being overloaded as a result of the supply of a required short-circuit current. Nevertheless, in the case of, for example, a short-circuit from the first output terminal to a supply potential coupled to the collector of the second transistor, the first power transistor is forced to supply a required short-circuit current.

A disadvantage of such an amplifier arrangement is therefore that despite the removal of the drive, the power transistors have to deliver the required short-circuit current, as a result of which the power transistors may be overloaded.

SUMMARY OF THE INVENTION

It is an object of the invention to provide an amplifier arrangement which is safeguarded against the delivery of a required short-circuit current by the power transistors.

An amplifier arrangement in accordance with the invention is characterized in that, in addition to being adapted to generate the control signal, the third means are adapted to supply a first short-circuit current to one of the output terminals during a first short-circuit mode and to supply a second short-circuit current to one of the output terminals during a second short-circuit mode, these short-circuit currents being related to the sum of the first signal and the second signal. Since the amplifier arrangement is adapted to supply the first or the second short-circuit current with the aid of the third means, the power transistors are not forced to supply a current as a result of the occurrence of a short-circuit.

A first embodiment of an amplifier arrangement in accordance with the invention may be characterized in that the third means, for supplying the first short-circuit current, comprise a first controlled unidirectional element having a control input for receiving the sum of the first signal and the second signal and having a current path for carrying the first short-circuit current, which current path is coupled in parallel with the main current path of the first power transistor, and the third means, for supplying the second short-circuit current, comprise a second controlled unidirectional element having a control input for receiving the sum of the first signal and the second signal and having a current path for carrying the second short-circuit current, which current path is coupled in parallel with the main current path of the second power transistor. An advantage of the present embodiment is that after activation of the third means, the controlled unidirectional elements, for example thyristors, remain conductive until a short-circuit has ceased, the sustained conduction being the result of a memory effect inherent in the relevant elements.

A second embodiment of an amplifier arrangement in accordance with the invention may be characterized in that the third means comprise an input resistor coupled between the mutually coupled control inputs of the controlled unidirectional elements and a node common to the serially coupled current paths of the controlled unidirectional elements. The input resistor provides a possibility of converting a current, caused by a difference between the first and the second signal, into voltage, on the basis of which voltage the unidirectional elements can be controlled.

A third embodiment of an amplifier arrangement in accordance with the invention may be characterized in that the first controlled unidirectional element comprises a first and second transistor, and the second controlled unidirectional element comprises a third and a fourth transistor, these transistors each having a base, a collector and an emitter, the base of the first transistor and the collector of the second transistor forming the control input of the first controlled unidirectional element, the collector of the first transistor being coupled to the base of the second transistor, and the current path of the first transistor controlled unidirectional element being interposed between the emitters of the first and the second transistor, the base of the third transistor and the collector of the fourth transistor constituting the control input of the second controlled unidirectional element, the collector of the third transistor being coupled to the base of the fourth transistor, and the second controlled unidirectional element being interposed between the emitters of the third transistor and the fourth transistor. The present embodiment yields an advantageous implementation of the two unidirectional elements, the input resistor coupled between the bases and the emitters of the first transistor and the third transistor in conjunction with a base-emitter voltage required for the first transistor and the third transistor providing an activation threshold for the activation of the third means.

A fourth embodiment of an amplifier arrangement in accordance with the invention may be characterized in that the third means comprise a first and a second output transistor each having a base, a collector and an emitter, the bases of the first and the second output transistor being coupled to the bases of the second and the fourth transistor, respectively, the emitters of the first and the second output transistor being coupled to the emitters of the second and the fourth transistor, respectively, and the collectors of the first and the second output transistor being coupled to the protection means. The output transistors thus coupled are turned on when the unidirectional elements are turned on. As a result of this, the control signal is applied to the protection means for a desired length of time.

A fifth embodiment of an amplifier arrangement in accordance with the invention may be characterized in that the third means comprise a fifth and a sixth transistor each having a base, a collector and an emitter, the bases of the fifth and the sixth transistor, being coupled to the bases of the second and the fourth transistor respectively, the emitters of the fifth and the sixth transistor being coupled to the emitters of the second and the fourth transistor, respectively, and the collectors of the fifth and the sixth transistor, being coupled to the emitters of the first and the third transistor respectively. The transistors thus coupled when the unidirectional elements are turned on. Consequently, not only the unidirectional elements but also the fifth and the sixth transistor contribute to the short-circuit currents.

A sixth embodiment of an amplifier arrangement in accordance with the invention may be characterized in that the first means comprise a current mirror comprising at least a first and a second current-mirror transistor having a base, an emitter and a collector, the bases being coupled to one another and to the collector of the first current-mirror transistor, the collectors being coupled to the second means, and the emitter being coupled to one another by means of a series arrangement of three resistors having a first tap coupled to a first supply terminal and having a second tape coupled to the main current path of the first transistor, and said first means comprising an output transistor having a base, a collector and an emitter, the base being coupled to the collector of the second current-mirror transistor, the collector being coupled to the third means, and the emitter being coupled to the emitter of the first current-mirror transistor, and in that the second means comprise a current mirror comprising at least a third and a fourth current-mirror transistor each having a base, an emitter and a collector, the bases being coupled to one another and to the collector of the third current-mirror transistor, the collectors being coupled to the first means, and the emitters being coupled to one another by means of a series arrangement of three resistors having a third tap coupled to a second supply terminal and having a fourth tap coupled to the main current path of the second transistor, the second means also comprising an output transistor having a base, a collector and an emitter, the base being coupled to the collector of the fourth current-mirror transistor, the collector being coupled to the third means, and the emitter being coupled to the emitter of the second current-mirror transistor. Moreover, the sixth embodiment may be characterized in that the collectors of the first and the third current-mirror transistor and the collectors of the second and the fourth current-mirror transistor are coupled. The sixth embodiment enables a short-circuit detection circuit constituted by the first and the second means to be implemented simply, the currents in the two current mirrors as well as the two output transistors being similar in the absence of a short-circuit and being different in the case of a short-circuit.

BRIEF DESCRIPTION OF THE DRAWING

The above and other (more detailed) features of the invention will be described and explained more elaborately with reference to the accompanying drawing in which:

The FIGURE shows an embodiment of an amplifier arrangement in accordance with the invention.

DESCRIPTION OF THE PREFERRED EMBODIMENT

The accompanying Figure shows an embodiment of an amplifier arrangement in accordance with the invention, which arrangement comprises a first amplifier A1, a second amplifier A2, first means M1, second means M2 and third means M3. The amplifiers A1 and A2 comprise a first power transistor PT1 and a second power transistor PT2, and a third power transistor PT3 and a fourth power transistor PT4, respectively, a first input terminal 1 and a second input terminal 2, and a third input terminal 3 and a fourth input terminal 4, respectively, and a first output terminal 5 and a second output terminal 6, respectively. The power transistors PT1, PT2, PT3 and PT4 each have a base, a collector and an emitter, the bases of the power transistors PT1, PT2, PT3 and PT4 being coupled to the input terminals 1, 2, 3 and 4, respectively, the collectors of the power transistors P1 and PT4 being coupled to one another and the collectors of the power transistors PT2 and PT3 being coupled to one another, the emitters of the power transistors PT1 and PT3 being coupled to the output terminal 5, and the emitters of the power transistors PT2 and PT4 being coupled to the output terminal 6. The first means M1 comprise a current mirror (CT1, CT2) having a first current-mirror transistor CT1 and a second current-mirror transistor CT2, and an output transistor OT1, which transistors each have a base, a collector and an emitter, the bases of the current-mirror transistors CT1 and CT2 being coupled to the collector of the current-mirror transistor CT1, the collectors of the current-mirror transistor CT1 and CT2 being coupled to the second means M2, the emitters of the current-mirror transistors CT1 and CT2 being coupled to one another by means of a series arrangement if three resistors R1, R2 and R3, the base of the transistor OT1 being coupled to the collector of the current-mirror transistor CT2, the collector of the transistor OT1 being coupled to the third means M3, and the emitter of the transistor OT1 being coupled to the emitter of the current-mirror transistor CT1. In addition, a first tap between the resistors R1 and R2 is coupled to a first supply terminal 7 and a second tap between the resistors R2 and R3 is coupled to the collectors of the power transistors PT1 and PT4. The second means M2 comprise a current mirror (CT3, CT4) having a third current-mirror transistor CT3 and a fourth current-mirror transistor CT4, and an output transistor OT2, which transistors each have a base, a collector and an emitter, the bases of the current-mirror transistors CT3 and CT4 being coupled to the collector of the current-mirror transistor CT3, the collectors of the current-mirror transistors CT3 and CT4 being coupled to the first means M1, the emitters of the current-mirror transistors CT3 and CT4 being coupled to one another by means of a series arrangement of three resistors R4, R5 and R6, the base of the transistor OT2 being coupled to the collector of the current-mirror transistor CT4, the collector of the transistor OT2 being coupled to the third means M3, and the emitter of the transistor OT2 being coupled to the emitter of the current-mirror transistor CT1. Moreover, a third tap between the resistors R4 and R5 is coupled to a second supply terminal 8 and a fourth tap between the resistors R5 and R6 is coupled to the collectors of the power transistors PT2 and PT3. In the present embodiment the collectors of the current-mirror transistors CT1 and CT3 and the collectors of the current-mirror transistors CT2 and CT4 are coupled by means of a resistor R7 and a resistor R8, respectively, although the relevant resistors may be replaced by various components or circuit sections. The third means M3 comprise a first controlled unidirectional element (T1, T2) with a first transistor T1 and with a second transistor T2, and a second controlled unidirectional element (T3, T4) with a third transistor T3 and with a fourth transistor T4, the means also comprising a fifth transistor T5, a sixth transistor T6, a first output transistor OT3, a second output transistor OT4, which transistors each have a base, a collector and an emitter, the bases of the transistors T1 and T3 and the collectors of the transistors T2 and T4 being coupled to the collectors of the transistors OT1 and OT2, the collector of the transistor T1 being coupled to the base of the transistor T2, the collector of the transistor T3 being coupled to the base of the transistor T4, the emitters of the transistors T1 and T3 being coupled to a common node 9, the emitters of the transistors T2 and T4 being respectively coupled to the second tap between the resistors R2 and R3 and to the fourth tap between the resistors R5 and R6, the bases of the transistors T5 and T6 being coupled to the bases of the transistors T2 and T4, respectively, the emitters of the transistors T5 and T6 being coupled to the emitters of the transistors T2 and T4 respectively, the collectors of the transistors T5 and T6 being coupled to the output terminals 5 and 6, respectively, the bases of the output transistors OT3 and OT4 being coupled to the bases of the transistors T2 and T4 respectively, the emitters of the output transistors OT3 and OT4, being coupled to the emitters of the transistors T2 and T4 respectively, and the collectors of the output transistors OT3 and OT4 being coupled to the protection means. The third means M3 further comprise an input resistor R9 coupled between the bases of the transistors T1 and T3 and the node 9, a resistor R10 coupled between the collector of the transistor T1 and the emitter of the transistor T2, a resistor R11 coupled between the collector of the transistor T3 and the emitter of the transistor T4, a resistor R12 coupled between the node 9 and the output terminal 5, a resistor R13 coupled between the node 9 and the output terminal 6, a resistor R14 coupled between the collector of the transistor T5 and the output terminal 5, and a resistor R15 coupled between the collector of the transistor T6 and the output terminal 6.

When in the present embodiment a load is coupled between the output terminals 5 and 6 and a drive is applied to the input terminals 1, 2, 3 and 4, a first load current will flow via the output terminal 5 and a second load current will flow via the output terminal 6. The respective load currents result inter alia from a first current i1 related to the drive and flowing via the collector of the power transistor PT1 and from a second current i2 related to the drive and flowing via the collector of the power transistor PT2, the current i1 producing a voltage drop across the resistor R2 and the current i2 producing a voltage drop across the resistor R5. As in the absence of a short-circuit, the load current flowing towards the load is equal to the load current flowing away from the load, the current i1 related to the first load current is equal to the current i2 related to the second load current and the voltage drop produced by the current i1 is equal to the voltage drop produced by the current i2. Depending upon the voltage drop produced by the current i1, the first means M1 generate a first signal s1 flowing via the collector of the output transistor OT1 and depending on the voltage drop produced by the current i2, the second means M2 generate a second signal s2 flowing via the collector of the output transistor OT2. As the respective voltage drops are equal and the signals related to the voltage drops are equal, a sum of the respective signals will not result in an actuation of the third means M3 and will not result in a limitation of the load currents. For a more comprehensive description of the first and second means M1 and M2, reference is made to the above-mentioned European Patent Application 90201757.3. However, in the case of a short-circuit, the load current flowing to the load is not equal to the load current flowing away from the load. Consequently, the current i1 related to the first load current is not equal to the current i2 related to the second load current and the voltage drop produced by the current i1 is not equal to the voltage drop produced by the current i2. Since the respective voltage drops are not equal, the signals s1 and s2 related to the voltage drops will not be equal and the sum of the respective signals s1 and s2 will result in an actuation of the third means M3. Actuation of third means M3 is effected in that a difference between the signals s1 and s2 results in a current through the input resistor R9, which current produces a voltage across the input resistor R9. When the voltage exceeds a base-emitter voltage required for the transistor T1, the transistors T1, T2, T5 and OT3 become conductive, which conduction causes the third means M3 to be set to a first short-circuit mode, a short-circuit current being fed through the transistors T1, T2 and T5 and a control signal r1 through the output transistor OT3. When the voltage exceeds a base-emitter voltage required for the transistor T3, the transistors T3, T4, T6 and OT4 are driven into conduction, causing the third means M3 to be set to a second short-circuit mode, a short-circuit current k2 being fed through the transistors T3, T4 and T6 and a control signal r2 through the output transistor OT4. The respective short-circuit currents k1 and k2 serve to supply a current to one of the output terminals during a short-circuit and the respective control signals r1 and r2 serve to actuate the protection means, the short-circuit currents k1 and k2 reducing the load to the power transistors PT1, PT2, PT3 and PT4 and the protection means removing the drive from these power transistors. The resistors R10, R11, R12, R13, R14 and R15 used in the third means M3 in addition to the resistor R9 provide biassing and current-limiting.

The invention is not limited to the present embodiment. Within the scope of the invention several modifications are conceivable to those skilled in the art. For example, the first and the second means can be coupled or constructed in different manners, for example by means of separate current detectors for each power transistor, although the sum of the first and the second signal is not required in the present case. The third means can also be coupled or constructed in different manners. In a simple modification of the third means, the controlled unidirectional elements shown in the accompanying Figure may, for example, be replaced by thyristors. In a drastic modification of the third means, the relevant unidirectional elements may, for example, be replaced by a series arrangement of a buffer and a set-reset flip-flop, the buffer being coupled to a set input of the flip-flop and a first output of the flip-flop being coupled to the bases of the output transistors and of the fifth and the sixth transistor respectively. For example, the set-reset flip-flop can then be set by means of a threshold circuit and be reset by means of a timer, which threshold circuit may form part of the buffer and which timer may be coupled between a reset input and an output of the flip-flop which output is inverted relative to the first output. In the case of the series arrangement a holding action which said unidirectional elements or thyristors exhibit is provided by the set-reset flip-flop. In order to preclude undesired switching effects, a delay element may be arranged in the third means.

We claim:

1. An amplifier arrangement comprising a first amplifier having a first output terminal for the connection of a first terminal of a load and having at least a first power transistor with a main current path for carrying a first current, said first current being related to a first load current flowing via the first output terminal; a second amplifier having a second output terminal for the connection of a second terminal of the load and having at least a second power transistor with a main current path for carrying a second current, said second current being related to a second load current flowing via the second output terminal; first means for generating a first signal, said first signal being related to the first current; second means for generating a second signal, said second being related to the second current; third means for generating at least one control signal, said at least one control signal being related to a sum of the first signal and the second signal; and protection means for limiting the first load current and the second load current depending upon the at least one control signal, characterized in that, in addition to being adapted to generate the at least one control signal, the third means are adapted to supply a first short-circuit current to one of the output terminals during a first short-circuit mode, and to supply a second short-circuit current to one of the output terminals during a second short-circuit mode, said first and second short-circuit currents being related to the sum of the first signal and the second signal.

2. An amplifier arrangement as claimed in claim 1, characterized in that the third means, for supplying the first short-circuit current, comprise a first controlled unidirectional element having a control input for receiving the sum of the first signal and the second signal and having a current path for carrying the first short-circuit current, said current path being coupled in parallel with the main current path of the first power transistor, and the third means, for supplying the second short-circuit current, comprise a second controlled unidirectional element having a control input for receiving the sum of the first signal and the second signal and having a current path for carrying the second short-circuit current, said current path being coupled in parallel with the main current path of the second power transistor.

3. An amplifier arrangement as claimed in claim 2, characterized in that the third means comprise an input resistor coupled between the mutually coupled control inputs of the controlled unidirectional elements and a node common to the serially coupled current paths of the controlled unidirectional elements.

4. An amplifier arrangement as claimed in claim 2, characterized in that the first controlled unidirectional element comprises a first transistor and a second transistor, and the second controlled unidirectional element comprises a third transistor and a fourth transistor, said first, second, third and fourth transistor each having a base, a collector and an emitter, the base of the first transistor and the collector of the second transistor forming the control input of the first controlled unidirectional element, the collector of the first transistor being coupled to the base of the second transistor, and the current path of the first controlled unidirectional element being interposed between the emitters of the first transistor and the second transistor, the base of the third transistor and the collector of the fourth transistor constituting the control input of the second controlled unidirectional element, the collector of the third transistor being coupled to the base of the fourth transistor, and the second controlled unidirectional element being interposed between the emitters of the third transistor and the fourth transistor.

5. An amplifier arrangement as claimed in claim 4, characterized in that the third means comprise a first and a second output transistor each having a base, a collector and an emitter, the bases of the first and the second output transistors being coupled to the bases of the second and the fourth transistors, respectively, the emitters of the first and the second output transistors being coupled to the emitters of the second and the fourth transistors, respectively, and the collectors of the first and the second output transistors being coupled to the protection means.

6. An amplifier arrangement as claimed in claim 4, characterized in that the third means comprise a fifth and a sixth transistor each having a base, a collector and an emitter, the bases of the fifth transistor and the sixth transistor being coupled to the bases of the second transistor and the fourth transistor, respectively, the emitters of the fifth transistor and the sixth transistor being coupled to the emitters of the second transistor and the fourth transistor, respectively, and the collectors of the fifth transistor and the sixth transistor being coupled to the emitters of the first transistor and the third transistor, respectively.

7. An amplifier arrangement as claimed in claim 1, characterized in that the first means comprise a current mirror comprising at least a first and a second current-mirror transistor each having a base, an emitter and a collector, the bases being coupled to one another and to the collector of the first current-mirror transistor, the collectors being coupled to the second means, and the emitters being coupled to one another by means of a series arrangement of three resistors having a first tap coupled to a first supply terminal and having a second tap coupled to the main current path of the first transistor, and said first means comprising an output transistor having a base, a collector and an emitter, the base being coupled to the collector of the second current-mirror transistor, the collector being coupled to the third means, and the emitter being coupled to the emitter of the first current-mirror transistor.

8. An amplifier arrangement as claimed in claim 7, characterized in that the second means comprise a current mirror comprising at least a third and a fourth current-mirror transistor each having a base, an emitter and a collector, the bases being coupled to one another and to the collector of the third current-mirror transistor, the collectors being coupled to the first means, and the emitters being coupled to one another by means of a series arrangement of three resistors having a third tap coupled to a second supply terminal and having a fourth tap coupled to the main current path of the second transistor, the second means also comprising an output transistor having a base, a collector and an emitter, the base being coupled to the collector of the fourth current-mirror transistor, the collector being coupled to the third means, and the emitter being coupled to the emitter of the second current-mirror transistor.

9. An amplifier arrangement as claimed in claim 8, characterized in that the collectors of the first and the third current-mirror transistor and the collectors of the second and the fourth current-mirror transistor are coupled.

10. An amplifier arrangement as claimed in claim 3, characterized in that the first controlled unidirectional element comprises a first and a second transistor, and the second controlled unidirectional element comprises a third and a fourth transistor, said first, second, third and fourth transistors each having a base, a collector and an emitter, the base of the first transistor and the collector of the second transistor forming the control input of the first controlled unidirectional element, the collector of the first transistor being coupled to the base of the second transistor, and the current path of the first controlled unidirectional element being interposed between the emitters of the first transistor and the second transistor, the base of the third transistor and the collector of the fourth transistor constituting the control input of the second controlled unidirectional element, the collector of the third transistor being coupled to the base of the fourth transistor, and the second unidirectional element being interposed between the emitters of the third transistor and the fourth transistor.

11. An amplifier arrangement as claimed in claim 10, characterized in that the third means comprises a first and a second output transistor, each having a base, a collector and an emitter, the bases of the first and second output transistors being coupled to the bases of the second and fourth transistors, respectively, the emitters of the first and the second output transistors being coupled to the emitters of the second and the fourth transistors, respectively, and the collectors of the first and the second output transistors being coupled to the protection means.

12. An amplifier arrangement as claimed in claim 10, characterized in that the third means comprises a fifth and a sixth transistor, each having a base, a collector and an emitter, the bases of the fifth and the sixth transistors being coupled to the bases of the second and the fourth transistors, respectively, the emitters of the fifth and the sixth transistors being coupled to the emitters of the second and the fourth transistors, respectively, and the collectors of the fifth and the sixth transistors being coupled to the emitters of the first and the third transistors, respectively.

13. An amplifier arrangement as claimed in claim 11, characterized in that the third means comprises a fifth and a sixth transistor, each having a base, a collector and an emitter, the bases of the fifth and the sixth transistors being coupled to the bases of the second and the fourth transistors, respectively, the emitters of the fifth and the sixth transistors being coupled to the emitters of the second and the fourth transistors, respectively, and the collectors of the fifth and the sixth transistors being coupled to the emitters of the first and the third transistors, respectively.

14. An amplifier arrangement as claimed in claim 5, characterized in that the third means comprises a fifth and a sixth transistor, each having a base, a collector and an emitter, the bases of the fifth and the sixth transistors being coupled to the bases of the second and the fourth transistors, respectively, the emitters of the fifth and the sixth transistors being coupled to the emitters of the second and the fourth transistors, respectively, and the collectors of the fifth and the sixth transistors being coupled to the emitters of the first and the third transistors, respectively.

* * * * *